(12) United States Patent
Yudovsky

(10) Patent No.: US 6,821,563 B2
(45) Date of Patent: Nov. 23, 2004

(54) GAS DISTRIBUTION SYSTEM FOR CYCLICAL LAYER DEPOSITION

(75) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 10 days.

(21) Appl. No.: 10/354,849

(22) Filed: Jan. 29, 2003

(65) Prior Publication Data

US 2004/0067641 A1 Apr. 8, 2004

Related U.S. Application Data

(60) Provisional application No. 60/415,544, filed on Oct. 2, 2002.

(51) Int. Cl.[7] .............................................. C23C 16/00
(52) U.S. Cl. ..................................... 427/248.1; 438/758
(58) Field of Search ................................ 438/758, 908; 427/248.1

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.2 |

(List continued on next page.)

FOREIGN PATENT DOCUMENTS

| | | | |
|---|---|---|---|
| EP | 1 167 569 | 1/2002 | C23C/16/455 |
| GB | 2 355 727 | 5/2001 | C23C/16/44 |
| JP | 58-98917 | 6/1983 | H01L/21/205 |

(List continued on next page.)

OTHER PUBLICATIONS

Yang, et al. "Atomic Layer Deposition of Tungsten Film from WF6/B2H6: Nucleation Layer for Advanced Semiconductor Device," Conference Proceedings ULSI XVII (2002) Materials Research Society.

(List continued on next page.)

Primary Examiner—John F. Niebling
Assistant Examiner—Olivia T. Luk
(74) Attorney, Agent, or Firm—Moser Patterson Sheridan

(57) ABSTRACT

Embodiments of the invention are generally directed to a cyclical layer deposition system, which includes a processing chamber, at least one load lock chamber connected to the processing chamber, a plurality of gas ports disposed on the processing chamber. The gas ports are configured to transmit one or more gas streams into the processing chamber. The system further includes a plurality of vacuum ports disposed on the processing chamber between the gas ports. The vacuum ports are configured to transmit the gas streams out of the processing chamber.

30 Claims, 6 Drawing Sheets

U.S. PATENT DOCUMENTS

| | | |
|---|---|---|
| 4,931,132 A | 6/1990 | Aspnes et al. ............... 156/601 |
| 4,951,601 A | 8/1990 | Maydan et al. ............. 118/719 |
| 4,960,720 A | 10/1990 | Shimbo ..................... 437/105 |
| 4,975,252 A | 12/1990 | Nishizawa et al. ......... 422/245 |
| 4,993,357 A | 2/1991 | Scholz ....................... 118/715 |
| 5,000,113 A | 3/1991 | Wang et al. ................ 118/723 |
| 5,013,683 A | 5/1991 | Petroff et al. ............... 437/110 |
| 5,028,565 A | 7/1991 | Chang et al. ............... 437/192 |
| 5,082,798 A | 1/1992 | Arimoto ..................... 437/108 |
| 5,085,885 A | 2/1992 | Foley et al. .................. 477/38 |
| 5,091,320 A | 2/1992 | Aspnes et al. .................. 437/8 |
| 5,130,269 A | 7/1992 | Kitahara et al. ............. 437/111 |
| 5,166,092 A | 11/1992 | Mochizuki et al. ......... 437/105 |
| 5,173,474 A | 12/1992 | Connell et al. ................ 505/1 |
| 5,186,718 A | 2/1993 | Tepman et al. ............ 29/25.01 |
| 5,205,077 A | 4/1993 | Wittstock ................. 51/165 R |
| 5,225,366 A | 7/1993 | Yoder ........................ 437/108 |
| 5,234,561 A | 8/1993 | Randhawa et al. .... 204/192.38 |
| 5,246,536 A | 9/1993 | Nishizawa et al. .......... 156/610 |
| 5,250,148 A | 10/1993 | Nishizawa et al. .......... 156/611 |
| 5,254,207 A | 10/1993 | Nishizawa et al. ......... 156/601 |
| 5,259,881 A | 11/1993 | Edwards et al. ............ 118/719 |
| 5,281,274 A | 1/1994 | Yoder ........................ 118/697 |
| 5,286,296 A | 2/1994 | Sato et al. .................. 118/719 |
| 5,290,748 A | 3/1994 | Knuuttila et al. ........... 502/228 |
| 5,294,286 A | 3/1994 | Nishizawa et al. ......... 156/610 |
| 5,296,403 A | 3/1994 | Nishizawa et al. ......... 437/133 |
| 5,300,186 A | 4/1994 | Kitahara et al. ............ 156/613 |
| 5,306,666 A | 4/1994 | Izumi ........................ 437/192 |
| 5,311,055 A | 5/1994 | Goodman et al. .......... 257/593 |
| 5,316,615 A | 5/1994 | Copel et al. ................. 117/95 |
| 5,316,793 A | 5/1994 | Wallace et al. .......... 427/248.1 |
| 5,330,610 A | 7/1994 | Eres et al. .................... 117/86 |
| 5,336,324 A | 8/1994 | Stall et al. .................. 118/719 |
| 5,338,389 A | 8/1994 | Nishizawa et al. ........... 117/89 |
| 5,348,911 A | 9/1994 | Jurgensen et al. ............ 117/91 |
| 5,374,570 A | 12/1994 | Nasu et al. ................... 437/40 |
| 5,389,793 A | 2/1995 | Aitken et al. .......... 250/492.21 |
| 5,395,791 A | 3/1995 | Cheng et al. ............... 437/105 |
| 5,438,952 A | 8/1995 | Otsuka ........................ 117/84 |
| 5,439,876 A | 8/1995 | Graf et al. .................. 505/447 |
| 5,441,703 A | 8/1995 | Jurgensen .................. 422/129 |
| 5,443,033 A | 8/1995 | Nishizawa et al. ........... 117/86 |
| 5,455,072 A | 10/1995 | Bension et al. ........... 427/255.7 |
| 5,458,084 A | 10/1995 | Thorne et al. ................ 117/89 |
| 5,469,806 A | 11/1995 | Mochizuki et al. ........... 117/97 |
| 5,480,818 A | 1/1996 | Matsumoto et al. ........... 437/40 |
| 5,483,919 A | 1/1996 | Yokoyama et al. ........... 117/89 |
| 5,484,664 A | 1/1996 | Kitahara et al. ............. 428/641 |
| 5,503,875 A | 4/1996 | Imai et al. ................ 427/255.3 |
| 5,521,126 A | 5/1996 | Okamura et al. ............ 437/235 |
| 5,527,733 A | 6/1996 | Nishizawa et al. .......... 437/160 |
| 5,532,511 A | 7/1996 | Nishizawa et al. .......... 257/627 |
| 5,540,783 A | 7/1996 | Eres et al. .................. 118/725 |
| 5,580,380 A | 12/1996 | Liu et al. ..................... 117/86 |
| 5,601,651 A | 2/1997 | Watabe ...................... 118/715 |
| 5,609,689 A | 3/1997 | Kato et al. .................. 118/719 |
| 5,616,181 A | 4/1997 | Yamamoto et al. ...... 118/723 R |
| 5,637,530 A | 6/1997 | Gaines et al. ............... 114/105 |
| 5,641,969 A | 6/1997 | Cooke et al. .......... 250/492.21 |
| 5,641,984 A | 6/1997 | Aftergut et al. ............. 257/433 |
| 5,644,128 A | 7/1997 | Wollnik et al. .............. 250/251 |
| 5,667,592 A | 9/1997 | Boitnott et al. ............. 118/719 |
| 5,674,786 A | 10/1997 | Turner et al. ............... 437/225 |
| 5,693,139 A | 12/1997 | Nishizawa et al. ........... 117/89 |
| 5,695,564 A | 12/1997 | Imahashi .................... 118/719 |
| 5,705,224 A | 1/1998 | Murota et al. ........... 427/248.1 |
| 5,707,880 A | 1/1998 | Aftergut et al. ................ 437/3 |
| 5,711,811 A | 1/1998 | Suntola et al. .............. 118/711 |
| 5,730,801 A | 3/1998 | Tepman et al. ............. 118/719 |
| 5,730,802 A | 3/1998 | Ishizumi et al. ............. 118/719 |
| 5,747,113 A | 5/1998 | Tsai ....................... 427/255.5 |
| 5,749,974 A | 5/1998 | Habuka et al. .............. 118/725 |
| 5,788,447 A | 8/1998 | Yonemitsu et al. ......... 414/217 |
| 5,788,799 A | 8/1998 | Steger et al. ................ 156/345 |
| 5,796,116 A | 8/1998 | Nakata et al. ................. 257/66 |
| 5,801,634 A | 9/1998 | Young et al. ................ 340/635 |
| 5,807,792 A | 9/1998 | Ilg et al. ..................... 438/758 |
| 5,830,270 A | 11/1998 | McKee et al. ............... 117/106 |
| 5,835,677 A | 11/1998 | Li et al. ..................... 392/401 |
| 5,851,849 A | 12/1998 | Comizzoli et al. ............ 438/38 |
| 5,855,675 A | 1/1999 | Doering et al. ............. 118/719 |
| 5,855,680 A | 1/1999 | Soininen et al. ............ 118/719 |
| 5,858,102 A | 1/1999 | Tsai ........................... 118/719 |
| 5,866,213 A | 2/1999 | Foster et al. ................. 427/573 |
| 5,866,795 A | 2/1999 | Wang et al. ................. 73/1.36 |
| 5,879,459 A | 3/1999 | Gadgil et al. ............... 118/715 |
| 5,882,165 A | 3/1999 | Maydan et al. ............. 414/217 |
| 5,882,413 A | 3/1999 | Beaulieu et al. ............ 118/719 |
| 5,904,565 A | 5/1999 | Nguyen et al. ............. 438/687 |
| 5,916,365 A | 6/1999 | Sherman ...................... 117/92 |
| 5,923,056 A | 7/1999 | Lee et al. .................... 257/192 |
| 5,923,985 A | 7/1999 | Aoki et al. .................. 438/301 |
| 5,925,574 A | 7/1999 | Aoki et al. ................... 437/31 |
| 5,928,389 A | 7/1999 | Jevtic ....................... 29/25.01 |
| 5,942,040 A | 8/1999 | Kim et al. ................... 118/726 |
| 5,947,710 A | 9/1999 | Cooper et al. ................ 418/63 |
| 5,972,430 A | 10/1999 | DiMeo, Jr. et al. ..... 427/255.32 |
| 5,981,403 A * | 11/1999 | Ma et al. .................... 438/758 |
| 6,001,669 A | 12/1999 | Gaines et al. ............... 438/102 |
| 6,015,590 A | 1/2000 | Suntola et al. ......... 427/255.23 |
| 6,015,917 A | 1/2000 | Bhandari et al. ............. 556/12 |
| 6,025,627 A | 2/2000 | Forbes et al. ............... 257/321 |
| 6,036,773 A | 3/2000 | Wang et al. .................. 117/97 |
| 6,042,652 A | 3/2000 | Hyun et al. ................. 118/719 |
| 6,043,177 A | 3/2000 | Falconer et al. ............... 502/4 |
| 6,051,286 A | 4/2000 | Zhao et al. .................. 427/576 |
| 6,062,798 A | 5/2000 | Muka ......................... 414/416 |
| 6,071,808 A | 6/2000 | Merchant et al. ........... 438/633 |
| 6,084,302 A | 7/2000 | Sandhu ....................... 357/751 |
| 6,086,677 A | 7/2000 | Umotoy et al. ............. 118/715 |
| 6,110,556 A | 8/2000 | Bang et al. ................. 428/64.1 |
| 6,113,977 A | 9/2000 | Soininen et al. .............. 427/64 |
| 6,117,244 A | 9/2000 | Bang et al. ................. 118/715 |
| 6,124,158 A | 9/2000 | Dautartas et al. ............ 438/216 |
| 6,126,753 A * | 10/2000 | Shinriki et al. ............. 118/715 |
| 6,130,147 A | 10/2000 | Major et al. ................ 438/604 |
| 6,139,700 A | 10/2000 | Kang et al. ............ 204/192.17 |
| 6,140,238 A | 10/2000 | Kitch ......................... 438/687 |
| 6,140,247 A | 10/2000 | Muraoka et al. ............ 438/743 |
| 6,143,659 A | 11/2000 | Leem ........................ 438/688 |
| 6,144,060 A | 11/2000 | Park et al. ................... 257/310 |
| 6,158,446 A | 12/2000 | Mohindra et al. .......... 134/25.4 |
| 6,174,377 B1 | 1/2001 | Doering et al. ............. 118/729 |
| 6,174,809 B1 | 1/2001 | Kang et al. ................. 438/682 |
| 6,183,563 B1 | 2/2001 | Choi et al. .................. 118/715 |
| 6,187,691 B1 | 2/2001 | Fukuda et al. .............. 438/758 |
| 6,197,683 B1 | 3/2001 | Kang et al. ................. 438/643 |
| 6,200,893 B1 | 3/2001 | Sneh .......................... 438/685 |
| 6,203,613 B1 | 3/2001 | Gates et al. ................. 117/104 |
| 6,206,176 B1 | 3/2001 | Blonigan et al. ............ 198/619 |
| 6,206,967 B1 | 3/2001 | Mak et al. ................... 118/666 |
| 6,207,302 B1 | 3/2001 | Sugiura et al. .............. 428/690 |
| 6,207,487 B1 | 3/2001 | Kim et al. ................... 438/238 |
| 6,213,704 B1 | 4/2001 | White et al. ................ 414/217 |
| 6,231,672 B1 | 5/2001 | Choi et al. .................. 118/715 |
| 6,235,634 B1 | 5/2001 | White et al. ................ 438/680 |
| 6,248,605 B1 | 6/2001 | Harkonen et al. ............. 438/29 |
| 6,270,572 B1 | 8/2001 | Kim et al. .................... 117/93 |
| 6,271,148 B1 | 8/2001 | Kao et al. ................... 438/727 |
| 6,284,646 B1 | 9/2001 | Leem ........................ 438/629 |

| | | | |
|---|---|---|---|
| 6,287,965 B1 | 9/2001 | Kang et al. ............... 438/648 |
| 6,291,876 B1 | 9/2001 | Stumborg et al. ........... 257/632 |
| 6,298,685 B1 | 10/2001 | Tepman ..................... 62/378 |
| 6,305,314 B1 | 10/2001 | Sneh et al. ............. 118/723 R |
| 6,306,216 B1 | 10/2001 | Kim et al. .................. 118/725 |
| 6,316,098 B1 | 11/2001 | Yitzchaik et al. ........... 428/339 |
| 6,333,260 B1 | 12/2001 | Kwon et al. ............... 438/643 |
| 6,342,277 B1 | 1/2002 | Sherman .................... 427/562 |
| 6,348,376 B2 | 2/2002 | Lim et al. ................... 438/253 |
| 6,348,420 B1 | 2/2002 | Raaijmakers et al. ....... 438/769 |
| 6,355,108 B1 | 3/2002 | Won et al. ................. 118/728 |
| 6,355,561 B1 | 3/2002 | Sandhu et al. ............. 438/676 |
| 6,358,829 B2 | 3/2002 | Yoon et al. ................. 438/597 |
| 6,369,430 B1 | 4/2002 | Adetutu et al. ............. 257/382 |
| 6,372,598 B2 | 4/2002 | Kang et al. ................ 438/399 |
| 6,379,748 B1 | 4/2002 | Bhandari et al. ..... 427/255.394 |
| 6,391,785 B1 | 5/2002 | Satta et al. ................. 438/704 |
| 6,392,245 B1 | 5/2002 | Edwards et al. ....... 250/492.21 |
| 6,399,491 B2 | 6/2002 | Jeon et al. .................. 438/680 |
| 6,416,577 B1 | 7/2002 | Suntoloa et al. ............. 117/88 |
| 6,416,822 B1 | 7/2002 | Chiang et al. .............. 427/561 |
| 6,420,189 B1 | 7/2002 | Lopatin ........................ 438/2 |
| 6,423,619 B1 | 7/2002 | Grant et al. ................ 438/589 |
| 6,428,850 B1 * | 8/2002 | Shinriki et al. ........ 427/255.32 |
| 6,428,859 B1 | 8/2002 | Chiang et al. .............. 427/457 |
| 6,447,607 B2 | 9/2002 | Soininen et al. ............ 117/200 |
| 6,447,933 B1 | 9/2002 | Wang et al. ................ 428/635 |
| 6,451,119 B2 | 9/2002 | Sneh et al. ................ 118/715 |
| 6,451,695 B2 | 9/2002 | Sneh ......................... 438/685 |
| 6,458,701 B1 | 10/2002 | Chae et al. ................. 438/680 |
| 6,468,924 B2 | 10/2002 | Lee et al. ................... 438/763 |
| 6,475,276 B1 | 11/2002 | Elers et al. ................... 117/84 |
| 6,475,910 B1 | 11/2002 | Sneh ......................... 438/685 |
| 6,478,872 B1 | 11/2002 | Chae et al. ................... 117/88 |
| 6,481,945 B1 | 11/2002 | Hasper et al. .............. 414/217 |
| 6,482,262 B1 | 11/2002 | Elers et al. ................... 117/84 |
| 6,482,733 B2 | 11/2002 | Raaijmakers et al. ....... 438/633 |
| 6,482,740 B2 | 11/2002 | Soininen et al. ............ 438/686 |
| 6,497,734 B1 * | 12/2002 | Barber et al. ............... 29/25.01 |
| 6,511,539 B1 | 1/2003 | Raaijmakers .............. 117/102 |
| 6,534,395 B2 | 3/2003 | Werkhoven et al. ........ 438/627 |
| 6,548,424 B2 | 4/2003 | Putkonen .................... 438/785 |
| 6,551,406 B2 | 4/2003 | Kilpi ......................... 117/728 |
| 6,720,027 B2 * | 4/2004 | Yang et al. ................ 427/123 |
| 2001/0000866 A1 | 5/2001 | Sneh et al. ............. 118/723 R |
| 2001/0002280 A1 | 5/2001 | Sneh ..................... 427/255.28 |
| 2001/0009140 A1 | 7/2001 | Bondestam et al. ........ 118/725 |
| 2001/0009695 A1 | 7/2001 | Saanila et al. ......... 427/255.39 |
| 2001/0011526 A1 | 8/2001 | Doering et al. ............. 118/729 |
| 2001/0013312 A1 | 8/2001 | Soininen et al. ............. 117/86 |
| 2001/0014371 A1 | 8/2001 | Kilpi ..................... 427/255.28 |
| 2001/0024387 A1 | 9/2001 | Raaijmakers et al. ....... 365/200 |
| 2001/0025979 A1 | 10/2001 | Kim et al. .................. 257/315 |
| 2001/0028924 A1 | 10/2001 | Sherman ................ 427/255.28 |
| 2001/0029094 A1 | 10/2001 | Mee-Young et al. ........ 438/597 |
| 2001/0034123 A1 | 10/2001 | Jeon et al. .................. 438/643 |
| 2001/0041250 A1 | 11/2001 | Werkhoven et al. ........ 428/212 |
| 2001/0042523 A1 | 11/2001 | Kesala ....................... 122/6.6 |
| 2001/0042799 A1 | 11/2001 | Kim et al. .................. 239/553 |
| 2001/0050039 A1 | 12/2001 | Park .......................... 117/102 |
| 2001/0054377 A1 | 12/2001 | Lindfors et al. ............ 117/104 |
| 2001/0054730 A1 | 12/2001 | Kim et al. .................. 257/301 |
| 2001/0054769 A1 | 12/2001 | Raaijmakers et al. ....... 257/758 |
| 2002/0000196 A1 | 1/2002 | Park .......................... 118/715 |
| 2002/0000598 A1 | 1/2002 | Kang et al. ................. 257/306 |
| 2002/0004293 A1 | 1/2002 | Soininen et al. ............ 438/584 |
| 2002/0007790 A1 | 1/2002 | Park .......................... 118/715 |
| 2002/0019121 A1 | 2/2002 | Pyo ........................... 438/618 |
| 2002/0020869 A1 | 2/2002 | Park et al. .................. 257/306 |
| 2002/0021544 A1 | 2/2002 | Cho et al. ................... 361/200 |
| 2002/0031618 A1 | 3/2002 | Sherman .................... 427/569 |
| 2002/0037630 A1 | 3/2002 | Agarwal et al. ............. 438/430 |
| 2002/0041931 A1 | 4/2002 | Suntola et al. .......... 427/255.28 |
| 2002/0048635 A1 | 4/2002 | Kim et al. ................... 427/331 |
| 2002/0048880 A1 | 4/2002 | Lee ............................. 438/253 |
| 2002/0052097 A1 | 5/2002 | Park .......................... 438/507 |
| 2002/0055235 A1 | 5/2002 | Agarwal et al. ............. 438/430 |
| 2002/0061612 A1 | 5/2002 | Sandhu et al. .............. 438/151 |
| 2002/0066411 A1 | 6/2002 | Chiang et al. .............. 118/724 |
| 2002/0068458 A1 | 6/2002 | Chiang et al. .............. 438/694 |
| 2002/0073924 A1 | 6/2002 | Chiang et al. ........... 118/723 R |
| 2002/0074588 A1 | 6/2002 | Lee ............................. 257/306 |
| 2002/0076481 A1 | 6/2002 | Chiang et al. ................. 427/8 |
| 2002/0076507 A1 | 6/2002 | Chiang et al. .............. 427/569 |
| 2002/0076508 A1 | 6/2002 | Chiang et al. .............. 427/569 |
| 2002/0076837 A1 | 6/2002 | Hujanen et al. ............... 438/3 |
| 2002/0081844 A1 | 6/2002 | Jeon et al. .................. 438/680 |
| 2002/0086106 A1 | 7/2002 | Park et al. ................ 427/248.1 |
| 2002/0090829 A1 | 7/2002 | Sandhu et al. .............. 438/761 |
| 2002/0092471 A1 | 7/2002 | Kang et al. ................. 118/715 |
| 2002/0094689 A1 | 7/2002 | Park .......................... 438/694 |
| 2002/0098627 A1 | 7/2002 | Pomarede et al. .......... 438/149 |
| 2002/0104481 A1 | 8/2002 | Chiang et al. ............ 118/723 I |
| 2002/0105088 A1 | 8/2002 | Yang et al. ................. 257/774 |
| 2002/0106536 A1 | 8/2002 | Lee et al. ................... 428/702 |
| 2002/0106846 A1 | 8/2002 | Seutter et al. .............. 438/200 |
| 2002/0108570 A1 | 8/2002 | Lindfors .................... 118/715 |
| 2002/0109168 A1 | 8/2002 | Kim et al. .................. 257/295 |
| 2002/0117399 A1 | 8/2002 | Chen et al. ................. 205/125 |
| 2002/0121697 A1 | 9/2002 | Marsh ....................... 257/751 |
| 2002/0134307 A1 | 9/2002 | Choi ......................... 118/715 |
| 2002/0135071 A1 | 9/2002 | Kang et al. ................. 257/767 |
| 2002/0144655 A1 | 10/2002 | Chiang et al. .............. 118/715 |
| 2002/0144657 A1 | 10/2002 | Chiang et al. .......... 118/723 R |
| 2002/0146511 A1 | 10/2002 | Chiang et al. ........... 427/248.1 |
| 2002/0155722 A1 | 10/2002 | Satta et al. ................. 438/704 |
| 2002/0162506 A1 | 11/2002 | Sneh et al. ................. 118/715 |
| 2002/0164421 A1 | 11/2002 | Chiang et al. ........... 427/248.1 |
| 2002/0164423 A1 | 11/2002 | Chiang et al. .......... 427/255.28 |
| 2002/0177282 A1 | 11/2002 | Song ......................... 438/300 |
| 2002/0182320 A1 | 12/2002 | Leskela et al. .............. 427/250 |
| 2002/0187256 A1 | 12/2002 | Elers et al. ................... 427/99 |
| 2002/0187631 A1 | 12/2002 | Kim et al. .................. 438/637 |
| 2002/0197402 A1 | 12/2002 | Chiang et al. .......... 427/255.39 |
| 2003/0004723 A1 | 1/2003 | Chihara ..................... 704/260 |
| 2003/0013320 A1 | 1/2003 | Kim et al. .................. 438/778 |
| 2003/0031807 A1 | 2/2003 | Elers et al. ................. 427/569 |
| 2003/0032281 A1 | 2/2003 | Werkhoven et al. ........ 438/640 |
| 2003/0042630 A1 | 3/2003 | Babcoke et al. ............ 261/121.1 |
| 2003/0049942 A1 | 3/2003 | Haukka et al. ............. 438/778 |
| 2003/0072975 A1 | 4/2003 | Shero et al. ................. 428/704 |
| 2003/0075273 A1 | 4/2003 | Kilpela et al. .......... 156/345.33 |
| 2003/0075925 A1 | 4/2003 | Lindfors et al. ............. 285/367 |
| 2003/0082296 A1 | 5/2003 | Elers et al. ................... 427/96 |
| 2003/0082300 A1 | 5/2003 | Todd et al. ............. 427/255.27 |

FOREIGN PATENT DOCUMENTS

| | | | |
|---|---|---|---|
| JP | 22-46161 | 9/1990 | ........... C23C/16/40 |
| JP | 42-91916 | 9/1992 | ........... C23C/16/48 |
| JP | 50-47666 | 2/1993 | ......... H01L/21/205 |
| JP | 52-06036 | 8/1993 | ......... H01L/21/205 |
| JP | 52-34899 | 9/1993 | ......... H01L/21/205 |
| JP | 52-70997 | 10/1993 | ........... C30B/29/68 |
| JP | 62-24138 | 5/1994 | ............ C23C/16/00 |
| JP | 2000-31387 | 1/2000 | ........... H01L/27/04 |
| JP | 2000-58777 | 2/2000 | ........... H01L/27/108 |
| JP | 2000-319772 | 3/2000 | ........... C23C/16/00 |
| JP | 2000-178735 | 6/2000 | ........... C23C/16/08 |
| JP | 2001-020075 | 11/2000 | ........... C23C/16/44 |
| JP | 10-308283 | 3/2001 | ........... C23C/16/40 |
| JP | 2001-111000 | 4/2001 | ......... H01L/27/105 |
| JP | 2001-172767 | 6/2001 | ........... C23C/16/40 |

| | | | | |
|---|---|---|---|---|
| JP | 2001-220294 | 8/2001 | ........... | C30B/29/20 |
| JP | 2001-254181 | 9/2001 | ........... | C23C/16/46 |
| WO | 96/17107 | 6/1996 | ........... | C23C/16/44 |
| WO | 98/51838 | 11/1998 | ........... | C23C/16/06 |
| WO | 99/01595 | 1/1999 | ........... | C30B/25/14 |
| WO | 99/29924 | 6/1999 | ........... | C23C/16/04 |
| WO | 99/65064 | 12/1999 | ........... | H01L/21/00 |
| WO | 00/15865 | 3/2000 | ........... | C23C/16/00 |
| WO | 00/16377 | 3/2000 | | |
| WO | 00/54320 | 3/2000 | ........... | H01L/21/44 |
| WO | 00/63957 | 10/2000 | ......... | H01L/21/205 |
| WO | 00/79576 | 12/2000 | ......... | H01L/21/205 |
| WO | 01/15220 | 3/2001 | ......... | H01L/21/768 |
| WO | 01/17692 | 3/2001 | ........... | B05C/11/00 |
| WO | 01/27346 | 4/2001 | ........... | C23C/16/44 |
| WO | 01/27347 | 4/2001 | ........... | C23C/16/44 |
| WO | 01/29280 | 4/2001 | ........... | C23C/16/32 |
| WO | 01/29891 | 4/2001 | ......... | H01L/21/768 |
| WO | 01/29893 | 4/2001 | ......... | H01L/21/768 |
| WO | 01/36702 | 5/2001 | ........... | C23C/16/00 |
| WO | 01/66832 | 9/2001 | ........... | C30B/25/14 |
| WO | 02/08485 | 1/2002 | ........... | C23C/16/00 |
| WO | 02/08488 | 1/2002 | ........... | C23C/16/44 |
| WO | 02/43115 | 5/2002 | | |
| WO | 02/45167 | 6/2002 | ........... | H01L/27/00 |
| WO | 02/067319 | 8/2002 | ......... | H01L/21/768 |

OTHER PUBLICATIONS

Rossnagel, et al. "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020.

Ritala, et al. "Perfectly Conformal TiN and $Al_2O_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid–Films, vol. 249, No. 2 (Sep. 15, 1994), pp. 155–162.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Atomic Layer Epitaxy Growth of TiN Thin Films," J. Electrochem. Soc., vol. 142, No. 8, Aug. 1995.

Ritala, et al. "Atomic Layer Epitaxy Growth of TiN Thin Films From $TiI_4$ and $NH_3$," J. Electrochem. Soc., vol. 145, No. 8 (Aug., 1998) pp. 2914–2920.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35. Proceedings of the ICEEE 1998 International Interconnect Technology Conference—San Francisco, California, Jun. 1–3, 1998.

Niinisto, et al. "Synthesis of Oxide Thin Films and Overlayers by Atomic Layer Epitaxy for Advanced Applications," Materials Science and Engineering B41 (1996) 23–29.

Min, et al. "Metal–organic Atomic–layer Deposition of Titanium–silicon–nitride films," Applied Physics Letters, vol. 75, No. 11 (Sep. 13, 1999).

Min, et al. "Chemical Vapor Deposition of Ti–Si–N Films With Alternating Source Supply," Mat. Rec. Soc. Symp. Proc. vol. (1999).

Min, et al. "Atomic Layer Deposition of TiN Thin Films by Sequential Introduction of Ti Precursor and NH3," Mat. Res. Soc. Symp. Proc. vol. 514 (1998).

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122–2128.

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $\{Nb_{1-x} Ta_x\}_2O_5$ Solid Solutions and $\{Nb_{1-x} Ta_x\}_2O_5$–$ZrO_2$ Nanolaminates Grown by Atomic Layer Epitaxy," 1997; p. 785–93.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Klaus, et al. "Atomically Controlled Growth of Tungsten and Tungsten Nitride Using Sequential Surface Reactions," Applied Surface Science, 162–163 (2000) 479–491.

Klaus, et al. "Atomic Layer Deposition of $SiO_2$ Using Catalyzed and Uncatalyzed Self–Limiting Surface Reactions," Surface Review and Letters, vol. 6, Nos. 3 & 4 (1999) 435–448.

Hwang, et al. "Nanometer–Size α–$PbO_2$–type $TiO_2$ in Garnet: A Thermobarometer for Ultrahigh–Pressure Metamorphism," Science Vo. 288 (Apr. 14, 2000).

George, et al. "Surface Chemistry for Atomic Layer Growth," J. Phys. Chem. 1996, 100, 13121–13131.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

GAS DISTRIBUTION SYSTEM FOR CYCLICAL LAYER DEPOSITION

CROSS-REFERENCE TO RELATED APPLICATIONS

This application claims benefit of U.S. provisional patent application Ser. No. 60/415,544, filed Oct. 2, 2002, which is herein incorporated by reference.

BACKGROUND OF THE INVENTION

1. Field of the Invention

Embodiments of the present invention generally relate to methods and apparatus for depositing materials on a substrate surface using cyclical layer deposition.

2. Description of the Related Art

As feature sizes for semiconductor substrates have become smaller and demand for efficient delivery of two or more precursors on a substrate surface have increased along with the need for more throughput, the desire to economically fabricate advanced semiconductor devices pushes processing sequences to ever-increasing levels of performance and productivity. Slow rates of deposition due to multiple processing steps, such as those of a conventional ALD process, are not conducive to achieving competitive performance and productivity. Further, ALD processes involving TiN, SiN and Si deposition require a low deposition rate with high film thickness. Many current systems, however, do not adequately meet such processing requirements.

Significant efforts have recently been made to find ways to meet current processing demands and requirements. One of the processes capable of meeting such demands and requirements is a cyclical layer deposition (CLD) process. Generally, CLD exposes a substrate to alternating reactants, and utilizes a phenomena known as adsorption, including physisorption and/or chemisorption, to deposit alternating layers of reactive molecules on a substrate surface.

Therefore, a need exists for an improved method and apparatus for depositing materials on a substrate surface using CLD.

SUMMARY OF THE INVENTION

Embodiments of the invention are generally directed to a cyclical layer deposition system, which includes a processing chamber, at least one load lock chamber connected to the processing chamber, and a plurality of gas ports disposed on the processing chamber. The gas ports are configured to transmit one or more gas streams into the processing chamber. The system further includes a plurality of vacuum ports disposed on the processing chamber between the gas ports. The vacuum ports are configured to transmit the gas streams out of the processing chamber.

In one embodiment, the invention is directed to a cyclical layer deposition system, which includes a processing chamber, and a wheel disposed inside the processing chamber. The wheel has a plurality of circumferentially distributed substrate carriers. The system further includes a module disposed inside the processing chamber. The module includes a plurality of gas ports configured to transmit one or more gas streams into the processing chamber and a plurality of vacuum ports configured to transmit the gas streams out of the processing chamber.

In another embodiment, the invention is directed to a method of processing a substrate. The method includes disposing a substrate in a load lock chamber, transferring the substrate from the load lock chamber to a processing chamber, and delivering one or more gas streams to a substrate surface through one or more gas ports disposed above the substrate while moving the substrate through the processing chamber.

In yet another embodiment, the invention is directed to a method of processing a substrate. The method includes mounting a substrate to one of a plurality of substrate carriers circumferentially disposed on a wheel inside a processing chamber, rotating the wheel, and delivering one or more gas streams to a substrate surface while rotating the wheel.

BRIEF DESCRIPTION OF THE DRAWINGS

So that the manner in which the above recited features of the present invention can be understood in detail, a more particular description of the invention, briefly summarized above, may be had by reference to the embodiments illustrated in the appended drawings and described in the specification. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
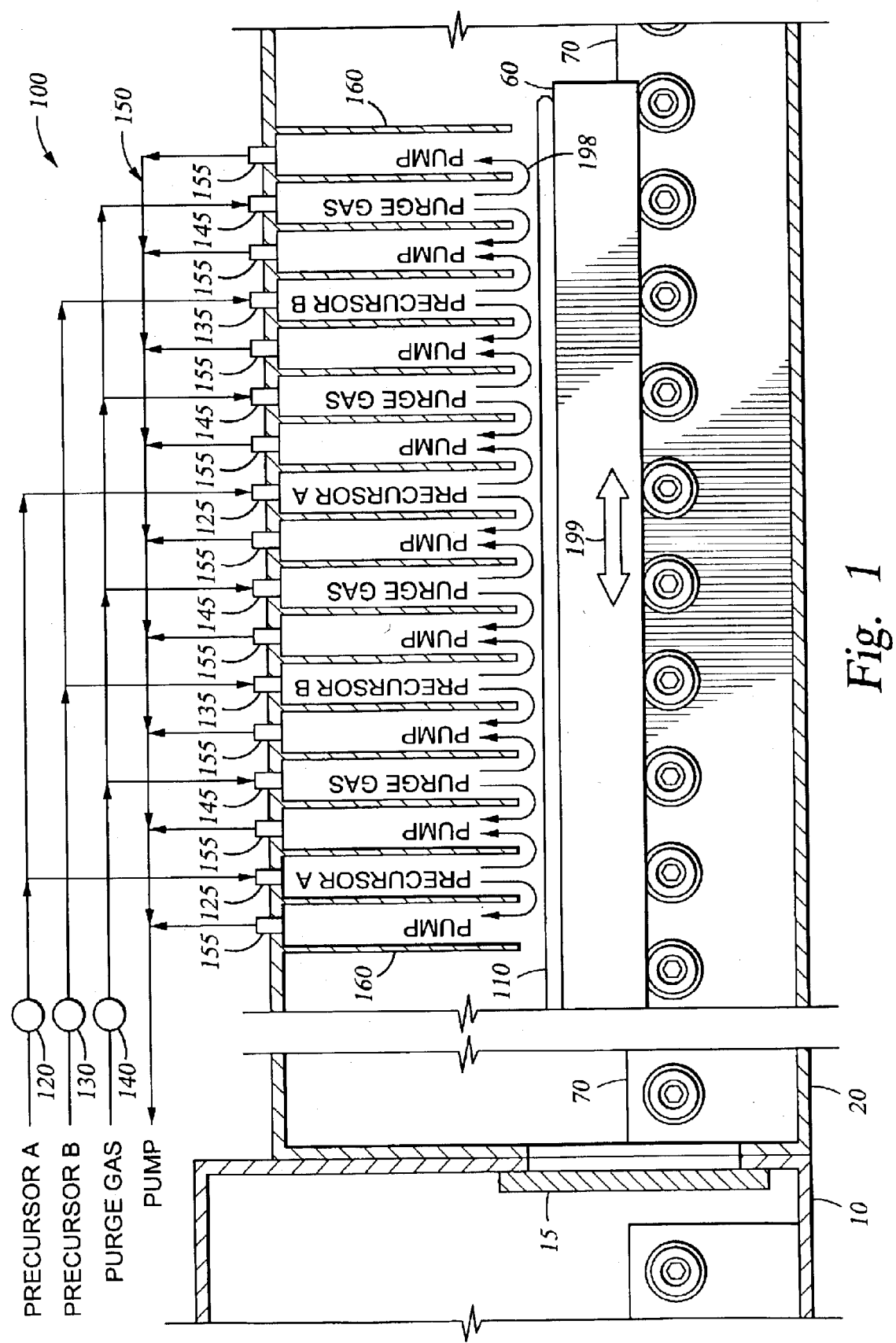
FIG. 1 is a schematic side view of a cyclical layer deposition system in accordance with an embodiment of the invention.

The invention is directed to various embodiments of a cyclical layer deposition reactor or system. In one embodiment, the system includes a processing chamber connected to at least one load lock chamber. The load lock chamber may be disposed at one end of the processing chamber or at both ends. The load lock chamber generally provides a mechanism for substrates to be delivered into the processing chamber and retrieved from the processing chamber. The processing chamber includes at least one shuttle for carrying a substrate. The processing chamber also defines a plurality of gas ports, vacuum ports and partitions. The gas ports are connected to either a precursor gas injector or a purge gas injector, which are configured to deliver gas streams into the processing chamber. Furthermore, the gas ports are disposed on a top portion of the processing chamber so that when a substrate passes underneath the gas ports, the gas streams will be delivered to the substrate surface in a direction perpendicular to the surface. The vacuum ports are connected to a pumping system configured to evacuate the gas streams out of the processing chamber. Furthermore, the vacuum ports are disposed in between each gas port so as to evacuate the gas streams after they react with the substrate surface. Each port is separated by a partition. Each partition extends downward from the top portion of the processing chamber to a distance proximate the substrate surface so as to allow the gas streams to flow around the lower portion. In this manner, the gas streams flow from the respective gas ports vertically downward toward the substrate surface, across the substrate surface and around the lower portions of the partitions, and finally upward toward the vacuum ports.

In another embodiment, the processing chamber has an annular shape. In such an embodiment, the gas ports, the vacuum ports and the partitions are disposed around a perimeter top portion of the processing chamber. In this manner, the substrates are processed as they are carried around the perimeter of the processing chamber.

In yet another embodiment, the processing chamber includes a wheel, which has a plurality of circumferentially distributed substrate carriers. The gas ports, the vacuum ports and the partitions are disposed in a module inside the processing chamber. In this embodiment, the substrates are processed as the wheel rotates.

The words and phrases used herein should be given their ordinary and customary meaning in the art by one skilled in the art unless otherwise further defined. The term "compound" is intended to include one or more precursors, reductants, reactants, and catalysts, or a combination thereof. The term "compound" is also intended to include a grouping of compounds, such as when two or more compounds are injected in a processing system at the same time. For example, a grouping of compounds may include one or more catalysts and one or more precursors. A wide variety of semiconductor processing precursor, compounds and reactants may be used. Examples may include titanium tetrachloride ($TiCl_4$), tungsten hexafluoride ($WF_6$), tantalum pentachloride ($TaCl_5$), titanium iodide ($TiI_4$), titanium bromide ($TiBr_4$), tetrakis(dimethylamido) titanium (TDMAT), pentakis(dimethyl amido) tantalum (PDMAT), tetrakis(diethylamido) titanium (TDEAT), tungsten hexacarbonyl ($W(CO)_6$), tungsten hexachloride ($WCl_6$), tetrakis (diethylamido) titanium (TDEAT), pentakis (ethyl methyl amido) tantalum (PEMAT), pentakis(diethylamido)tantalum (PDEAT), ammonia ($NH_3$), hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), and nitrogen ($N_2$), for example.

FIG. 1 is a schematic top view of a cyclical layer deposition system or reactor 100 in accordance with an embodiment of the invention. The system 100 includes a load lock chamber 10 and a processing chamber 20. The processing chamber 20 is generally a sealable enclosure, which is operated under vacuum, or at least low pressure. The processing chamber 20 is isolated from the load lock chamber 10 by an isolation valve 15. The isolation valve 15 seals the processing chamber 20 from the load lock chamber 10 in a closed position and allows a substrate 110 to be transferred from the load lock chamber 10 through the valve to the processing chamber 20 and vice versa in an open position.

The load lock chamber 10 includes a valve (not shown) that opens to a receiving station that is serviced by a robot (not shown). The robot is configured to deliver substrate 110 to the load lock chamber 10 through the valve. The robot may also be configured to retrieve substrate 110 from the load lock chamber 10. Any conventional substrate transfer assembly may be used, such as a robotic substrate transfer assembly described in the commonly assigned U.S. Pat. No. 4,951,601, entitled "Multi-chamber Integrated Process System", which is incorporated by reference herein. The robot may be generally known as an atmospheric robot and may be commercially available from such manufacturers as MECS, RORTZ, JEL, Daihen, Komatsu and other manufacturers known to those in the art.

The system 100 further includes a shuttle 60 for carrying substrate 110. The shuttle 60 is movable in both directions (as indicated by arrow 199) between the load lock chamber 10 and the processing chamber 20. The shuttle 60 may be controlled by a system computer, such as a mainframe, or by a chamber-specific controller, such as a programmable logic controller. The system 100 further includes a track 70 and a reversible motor or gear assembly (not shown) for moving the shuttle 60. The track 70 may include a plurality of guide rollers and pinion gears. The quantity of guide rollers and pinion gears may vary depending on the length of the chambers, the length of the shuttle 60 and the size of the substrate.

Alternatively, in lieu of shuttle 60, the system 100 may include a loading shuttle (not shown) and a process shuttle (not shown). The loading shuttle is configured to transfer substrate 110 from the load lock chamber 10 to the process shuttle prior to processing substrate 110. The process shuttle is configured to carry substrate 110 through the processing chamber 20. In this alternative, two tracks are generally disposed in the system 100, in which each track provides a path for moving the shuttle. The embodiments described herein are merely examples for moving or carrying substrate 110 in the system 100. The invention contemplates other mechanisms for carrying substrate 110, such as one described in the commonly assigned U.S. Pat. No. 6,298,685, entitled "Consecutive Deposition System", which is incorporated by reference herein.

The shuttle 60 may be a heated shuttle so that the substrate may be heated for processing. As an example, the shuttle 60 may be heated by heat lamps, a heating plate, resistive coils, or other heating devices, disposed underneath the shuttle 60.

The system 100 further includes a precursor injector 120, a precursor injector 130 and a purge gas injector 140. The injectors 120, 130, 140 may be controlled by a system computer (not shown), such as a mainframe, or by a chamber-specific controller, such as a programmable logic controller. The precursor injector 120 is configured to inject a continuous (or pulse) stream of a reactive precursor of compound A into the processing chamber 20 through a plurality of gas ports 125. The precursor injector 130 is configured to inject a continuous (or pulse) stream of a reactive precursor of compound B into the processing chamber 20 through a plurality of gas ports 135. The purge gas injector 140 is configured to inject a continuous (or pulse) stream of a non-reactive or purge gas into the processing chamber 20 through a plurality of gas ports 145. The purge gas is configured to remove reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, thereby avoiding cross-contamination between the precursors.

In another aspect, a remote plasma source (not shown) may be connected to the precursor injector 120 and the precursor injector 130 prior to injecting the precursors into the chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high intensity light source (e.g., UV energy), or exposure to an x-ray source. Exemplary remote plasma sources are available from vendors such as MKS Instruments, Inc. and Advanced Energy Industries, Inc.

The system 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The system 100 further includes a plurality of partitions 160 disposed on the processing chamber 20 between each port. A lower portion of each partition extends close to substrate 110, for example, about 0.5 mm or greater from the substrate surface. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors.

The system 100 may further include a structure to shift between a deposition mode and a cleaning mode. Generally, the cleaning mode assists the removal of unwanted by-product formation from the interior of the processing chamber 20. For example, a cleaning source (not shown) may be disposed above the processing chamber 20. The cleaning source is generally a compact system for providing cleaning reagents, typically in the form of fluorine or fluorine radicals, to remove contaminants and deposition by-products from the processing chamber 20. In one embodiment, the cleaning source is a remote plasma source that typically includes subsystems (not shown) such as a microwave generator (not shown) in electrical communication with a plasma applicator, an auto-tuner and an isolator. In another embodiment, the cleaning source provides a separate flow of gas that both cleans the processing chamber 20 and removes any non-adsorbed reactive species from the processing chamber 20.

The system 100 may further include a microprocessor controller (not shown), which may be one of any form of general-purpose computer processor (CPU) that can be used in an industrial setting for controlling various chambers, valves, shuttle movement, and gas injectors. The computer may use any suitable memory, such as random access memory, read only memory, floppy disk drive, hard disk, or any other form of digital storage, local or remote. Various support circuits may be coupled to the CPU for supporting the processor in a conventional manner.

Software routines may be stored in the memory or executed by a second CPU that is remotely located. The software routines are generally executed to perform process recipes or sequences. The software routines, when executed, transform the general-purpose computer into a specific process computer that controls the chamber operation so that a chamber process is performed. For example, software routines may be used to control the operation of the gas injectors. Alternatively, software routines may be performed in a piece of hardware, such as an application-specific integrated circuit.

In operation, substrate 110 is delivered (e.g., by a robot) to the load lock chamber 10 and is placed on the shuttle 60. After the isolation valve 15 is opened, the shuttle 60 is moved along the track 70. Once the shuttle 60 enters into the processing chamber 20, the isolation valve 15 closes, thereby sealing the processing chamber 20. The shuttle 60 is then moved through the processing chamber 20 for processing. In one embodiment, the shuttle 60 is moved in a linear path through the chamber 20.

As the shuttle 60 moves along the track 70, a surface of substrate 110 is repeatedly exposed to the precursor of compound A coming from gas ports 125 and the precursor of compound B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the precursors or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the substrate surface 110, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 110 may also be rotated while being exposed to the various gas streams.

Sufficient space is generally provided at the end of the processing chamber 20 so as to ensure complete exposure by the last gas port in the processing chamber 20. Once the shuttle 60 reaches the end of the processing chamber 20 (i.e., the substrate surface 110 has completely been exposed to every gas port in the chamber 20), the shuttle 60 returns back in a direction toward the load lock chamber 10. As the shuttle 60 moves back toward the load lock chamber 10, the substrate surface may be exposed again to the precursor of compound A, the purge gas, and the precursor of compound B, in reverse order from the first exposure. Arrow 199 indicates the shuttle 60 movement directions.

When the shuttle 60 reaches the isolation valve 15, the isolation valve 15 opens so as to allow the shuttle 60 to move through the isolation valve 15 to load lock chamber 10. The isolation valve 15 then closes to seal the processing chamber 20. Substrate 110 may be cooled by load lock chamber 10 prior to being retrieved by a robot for further processing.

The extent to which the substrate surface 110 is exposed to each gas may be determined by the flow rates of each gas coming out of the gas port. In one embodiment, the flow rates of each gas are configured so as not to remove adsorbed precursors from the substrate surface 110. The width between each partition, the number of gas ports disposed on the processing chamber 20, and the number of times the substrate is passed back and forth may also determine the extent to which the substrate surface 110 is exposed to the various gases. Consequently, the quantity and quality of a deposited film may be optimized by varying the above-referenced factors.

In another embodiment, the system 100 may include a precursor injector 120 and a precursor injector 130, without a purge gas injector 140. Consequently, as the shuttle 60 moves through the processing chamber 20, the substrate surface 110 will be alternatingly exposed to the precursor of compound A and the precursor of compound B, without being exposed to purge gas in between.

In yet another embodiment, the system 100 may be configured to process a plurality of substrates. In such an embodiment, the system 100 may include a second load lock chamber (disposed at an opposite end of the load lock chamber 10) and a plurality of shuttles to carry the substrates. The substrates may be delivered to the load lock chamber 10 and retrieved from the second load lock chamber. Each load lock chamber may have its own robot. In such an embodiment, the shuttle may be returned to load lock chamber 10 using an elevator (not shown) coupled to the second load lock chamber and a carrier return line (not shown) disposed above the processing chamber 20. The invention further contemplates any other mechanism, such as conveyor belts, that would facilitate processing a plurality of substrates through the system 200.

Figure 6:
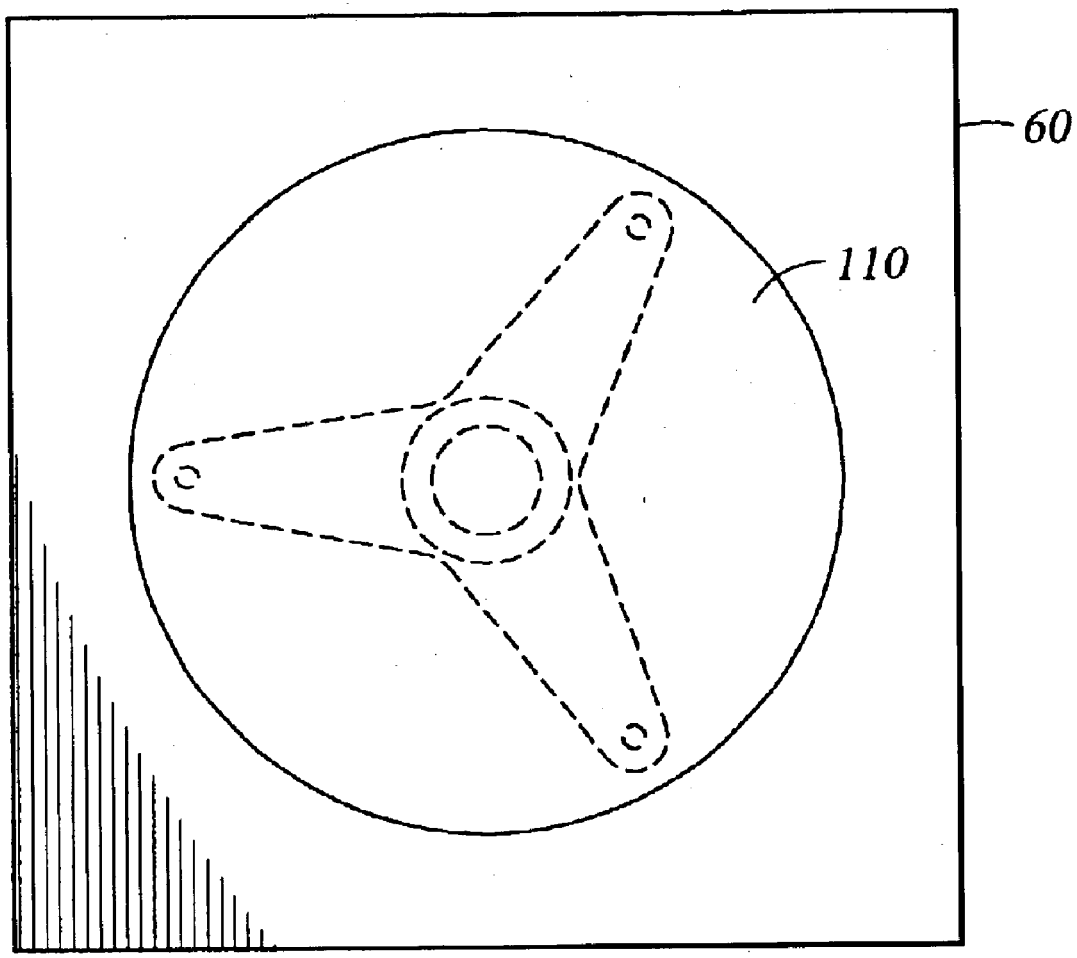
FIG. 6 is a schematic top view of a carrier in accordance with an embodiment of the invention.
Figure 7:
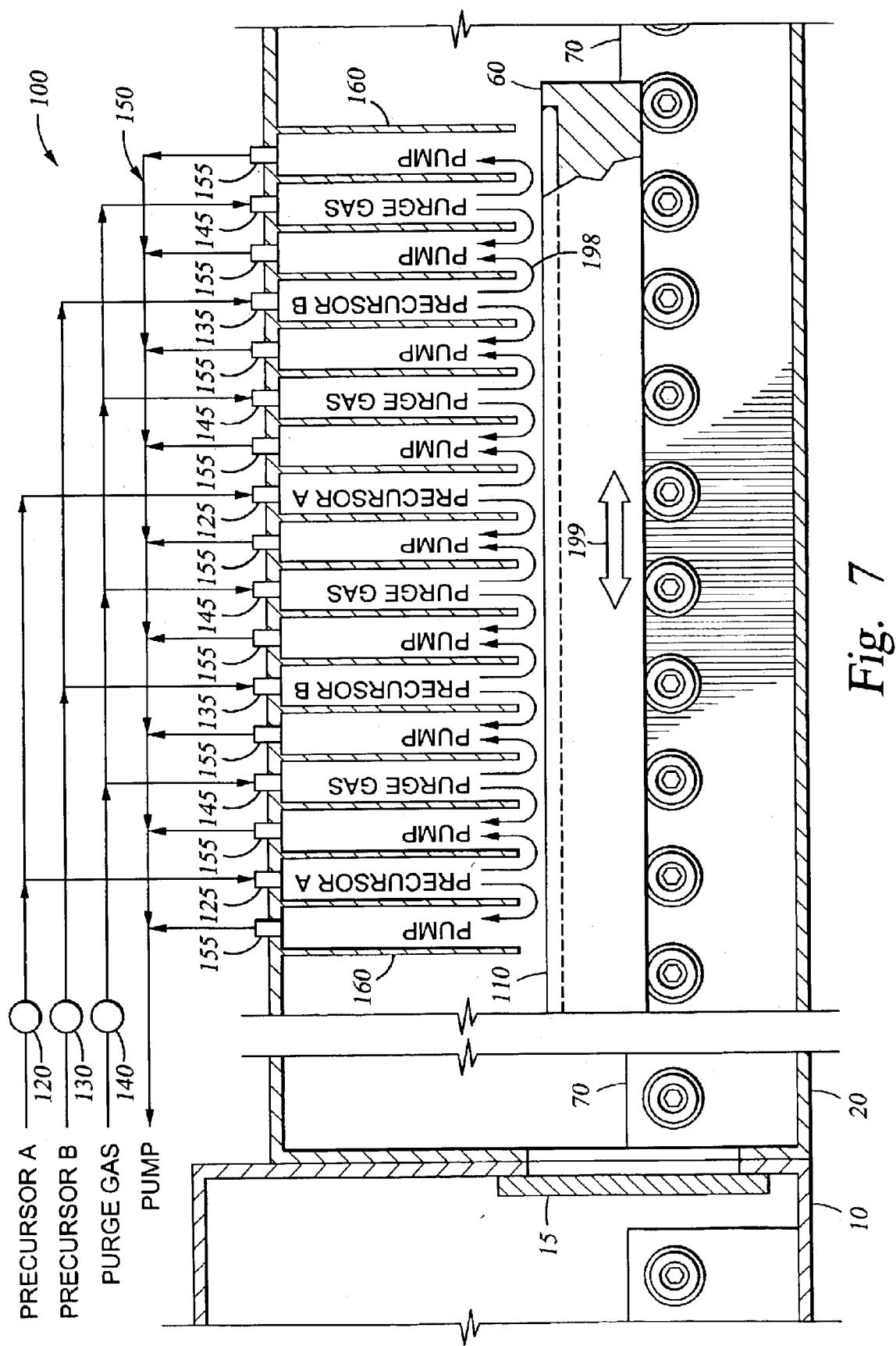
FIG. 7 is a schematic side view of a cyclical layer deposition system in accordance with an embodiment of the invention.

In still another embodiment, the shuttle 60 defines a recess 601 for containing substrate 110, as shown in FIG. 6. The recess 601 is configured such that when substrate 110 is disposed inside the recess 601, the top surface of substrate 110 is level with the top surface of the shuttle 60. In this manner, the distance between the lower portions of the partitions 160 and the substrate surface (and/or the shuttle surface 60) remains constant, which allows the gas streams to flow uniformly around the lower portions as the shuttle 60 moves through the processing chamber 20. FIG. 7 illustrates a schematic side view of a system 600 in accordance with this embodiment.

Figure 2:
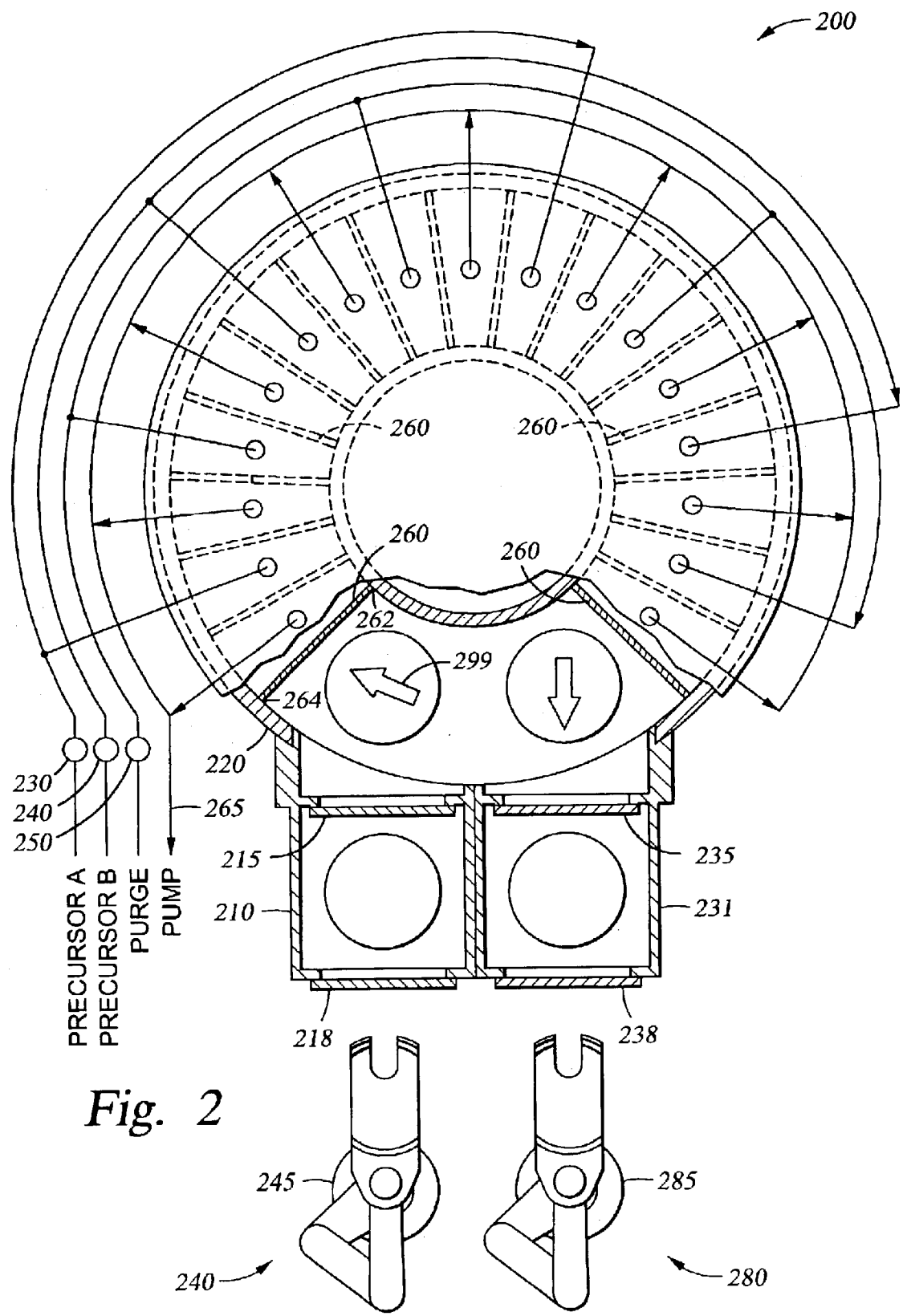
FIG. 2 is a schematic top view of a cyclical layer deposition system in accordance with an embodiment of the invention.

Referring now to FIG. 2, a schematic top view of a cyclical layer deposition system or reactor 200 in accordance with one embodiment of the invention is illustrated. The system 200 includes a first load lock chamber 210, a processing chamber 220, and a second load lock chamber 231. The processing chamber 220 has an annular shape, with a hollow center portion. The processing chamber 220 is isolated from load lock chamber 210 by an isolation valve 215. The isolation valve 215 is configured to seal the processing chamber 220 from load lock chamber 210 in a closed position and allows substrates to be transferred from load lock chamber 210 through the valve 215 to the processing chamber 220 in an open position. Load lock chamber 210 includes a valve 218 that opens to a receiving station 240 that is serviced by a robot 245, which is configured to deliver substrates to load lock chamber 210 through the valve 218.

Load lock chamber 231 is disposed proximate load lock chamber 210. Like load lock chamber 210, load lock chamber 231 is isolated from the processing chamber 220 by an isolation valve 235. The isolation valve 235 seals the processing chamber 220 from load lock chamber 231 in a closed position and allows substrates to be transferred from the processing chamber 220 to load lock chamber 231 through the isolation valve 235 in an open position. Load lock chamber 231 also includes a valve 238 that opens to a receiving station 280, which is serviced by a robot 285. The robot 285 is configured to retrieve substrates from load lock chamber 231.

The system 200 further includes a precursor injector 230, a precursor injector 240, and a purge gas injector 250. The precursor injector 230 is configured to inject a continuous (or pulse) stream of a reactive precursor of compound A into the processing chamber 220 through a first plurality of gas ports (not shown). The precursor injector 240 is configured to inject a continuous (or pulse) stream of a reactive precursor of compound B into the processing chamber 220 through a second plurality of gas ports (not shown). The purge gas injector 250 is configured to inject a continuous (or pulse) stream of a non-reactive or purge gas into the processing chamber 220 through a third plurality of gas ports (not shown). The gas ports for the purge gas are disposed in between the gas ports for the precursors so as to separate the precursors from each other (e.g., compound A from compound B), thereby avoiding cross-contamination between the precursors.

The system 200 further includes a pumping system 265 configured to evacuate the gas streams out of the processing chamber 220 through one or more vacuum ports (not shown). The vacuum ports are disposed between each gas port so that the gas streams are evacuated out of the processing chamber 220 after the gases react with the substrate surface. As with the purge gas ports, the vacuum ports are disposed between each gas port to further limit cross-contamination between the precursors.

The system 200 further includes a plurality of partitions 260 radially disposed on the processing chamber 220 between each port. More specifically, the partitions 260 are radially disposed between an inner perimeter 262 of the processing chamber 220 and an outer perimeter 264 of the processing chamber 220. A lower portion of each partition extends to a position close to substrate 110, for example about 0.5 mm or greater from the substrate surface. In this manner, the lower portions of the partitions 260 are separated from the substrate surface by a distance sufficient to allow the gas streams to flow toward the vacuum ports after the gas streams react with the substrate surface. The partitions 260 are also configured to limit cross-contamination between the precursors since they operate as a physical barrier to the precursors.

The system 200 may further include a plurality of shuttles (not shown) for carrying substrates. Each shuttle is configured to receive a substrate from the robot 245 at the load lock chamber 210, carry the substrate from load lock chamber 210 through the processing chamber 220 to load lock chamber 231. Each shuttle is configured to carry a substrate around the inner perimeter 262 of the processing chamber 220. The shuttle movement direction is indicated by arrow 299. The system 200 may further include a track (not shown) and a motor or gear assembly (not shown) for moving the shuttles.

In operation, the robot 245 delivers the plurality of substrates one at a time to load lock chamber 210. Once a substrate is positioned in load lock chamber 210, the substrate is transferred (e.g., by a shuttle) to the processing chamber 220. The substrate is then moved through the processing chamber 220 for processing. As each substrate moves through the processing chamber 220, a surface of each substrate is repeatedly exposed to the precursor of compound A and the precursor of compound B with purge gas in between. After each exposure to the various gas streams (e.g., the precursors or the purge gas), the gas streams are evacuated through the vacuum ports by the pumping system 250. Since a vacuum port may be disposed on both sides of a gas port, the gas streams may be evacuated through the vacuum ports on both sides of the respective gas port. In this manner, the precursors and the purge gas may be uniformly distributed across the substrate surface. The substrate may also be rotated while being exposed to the various gas streams.

In one embodiment, the substrate movement direction may be reversed. In such an embodiment, the substrates may be loaded at load lock chamber 231 and unloaded at load lock chamber 210.

Figure 3:
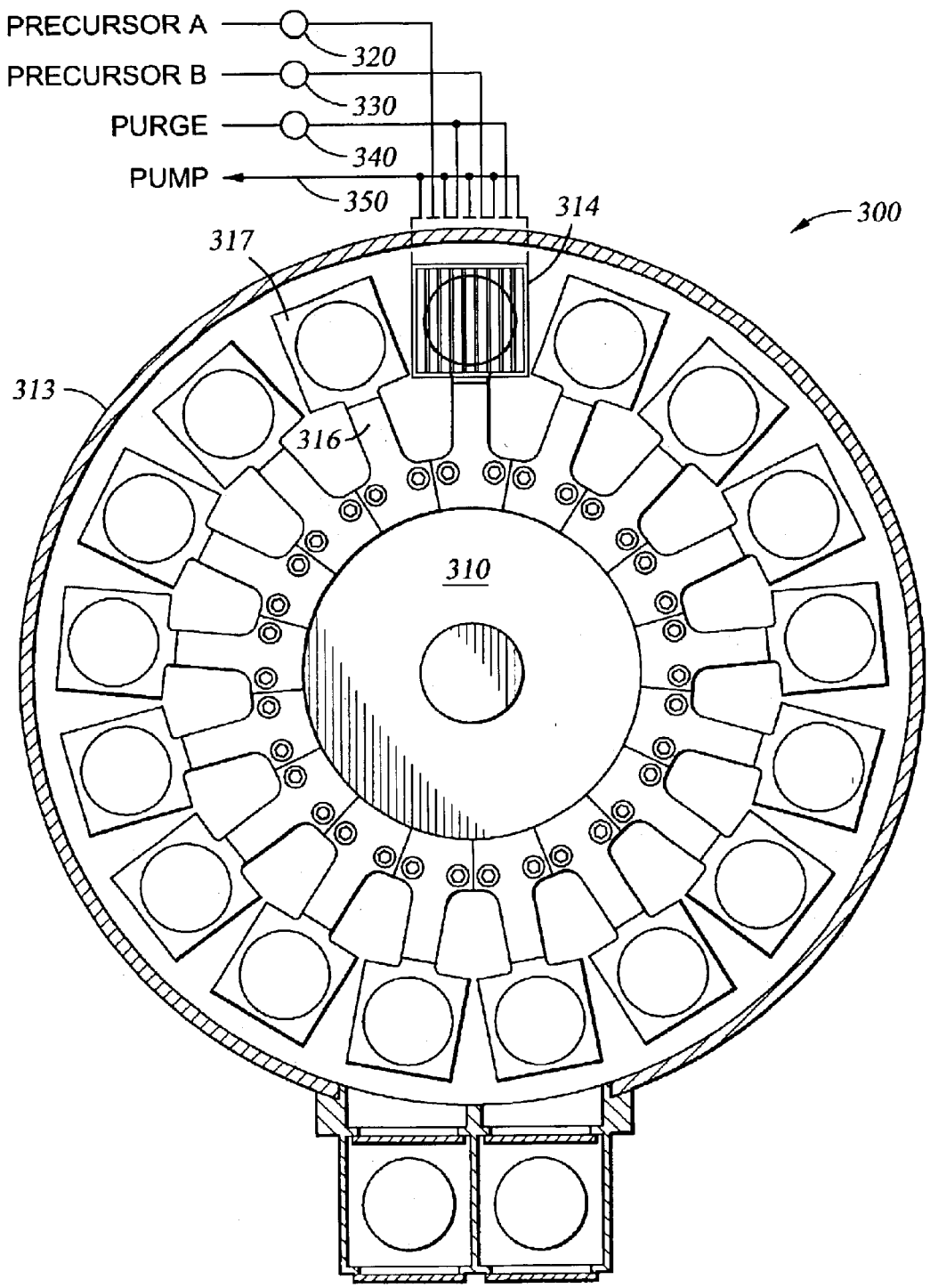
FIG. 3 is a schematic top view of a cyclical layer deposition system in accordance with an embodiment of the invention.
Figure 4:
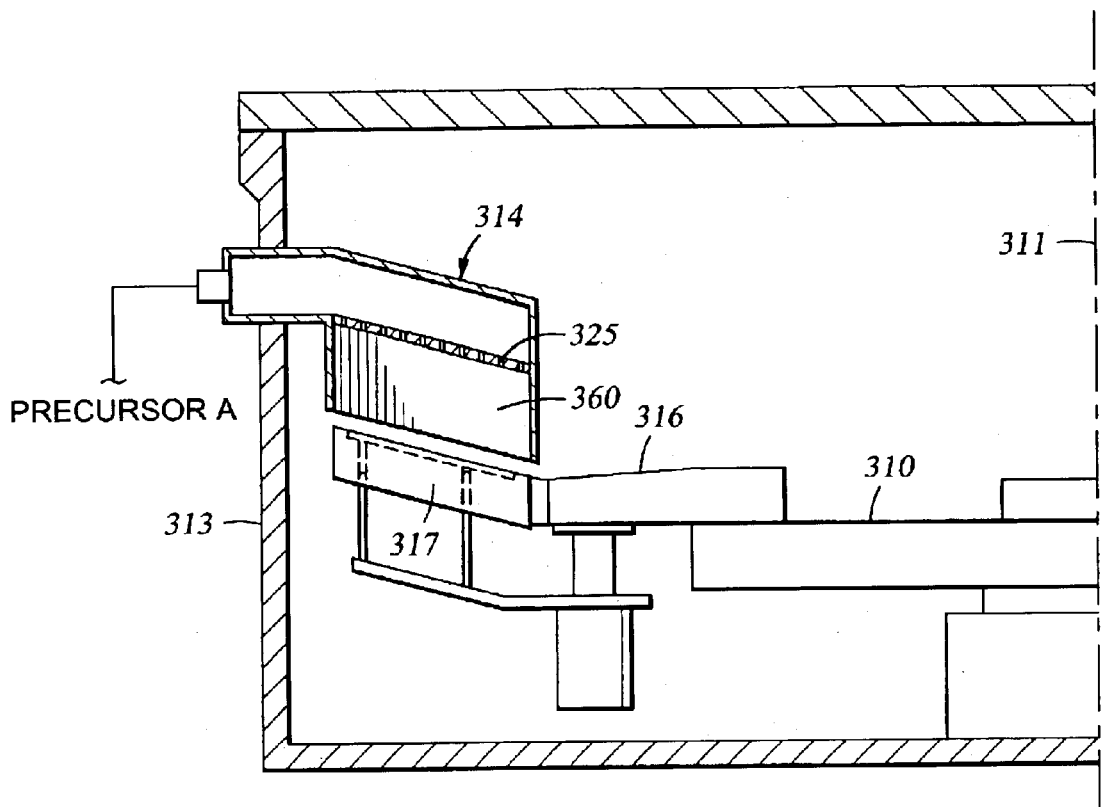
FIG. 4 is a cross-sectional view of a cyclical layer deposition system in accordance with an embodiment of the invention.

Referring now to FIGS. 3 and 4, a cyclical layer deposition system or reactor 300 in accordance with another embodiment of the invention is illustrated. The system 300 includes a wheel 310 mounted inside a processing chamber 313. The wheel 310 is configured to rotate about an axis 311 (FIG. 4).

The wheel 310 includes a number of radial spokes 316, each having a substrate carrier 317 at its outer extremity. Each substrate carrier 317 is configured to carry a substrate. The substrate supporting faces on the carrier 317 may be arranged to be angled slightly radially inwards relative to the axis of rotation of the wheel 310, so that on rotation, the substrates may be pressed firmly against the faces through centrifugal force.

Figure 5:
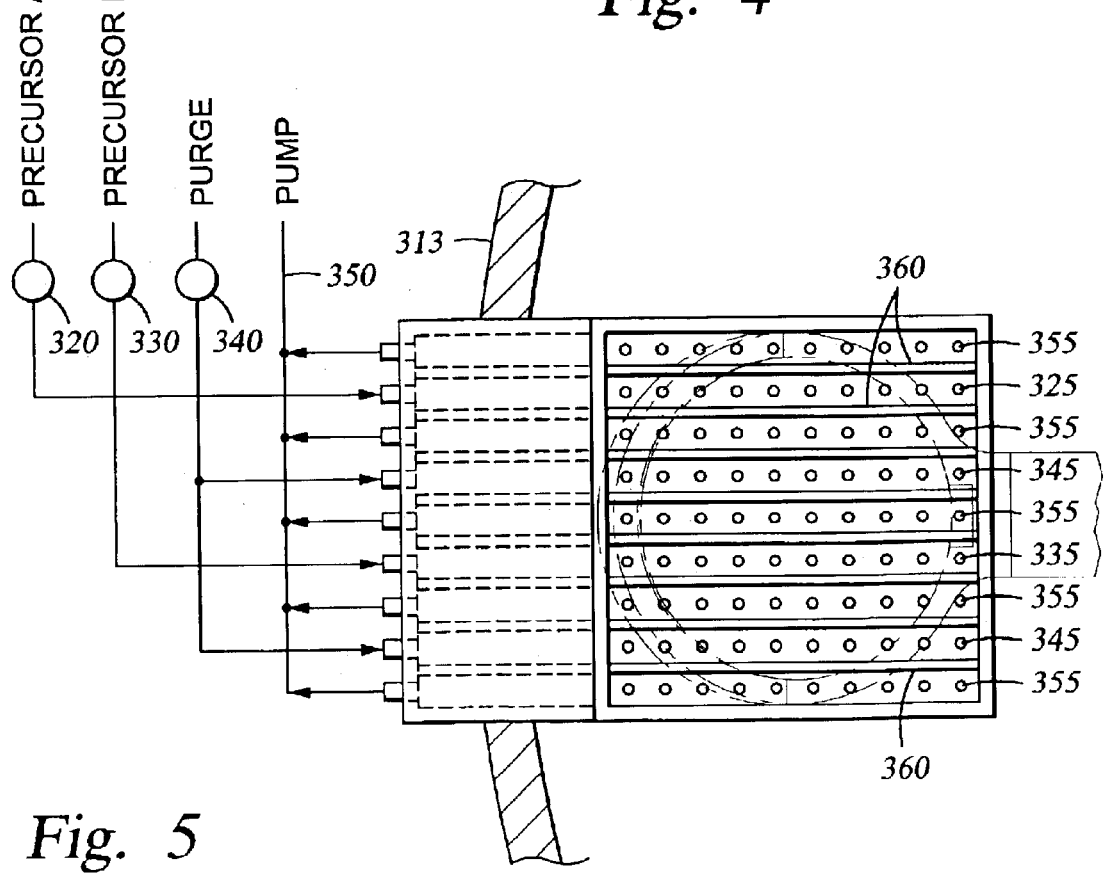
FIG. 5 is a schematic top view of a module in accordance with an embodiment of the invention.

The system 300 further includes a module 314. A schematic top view of the module 314 is illustrated in more detail in FIG. 5. The module 314 includes a plurality of gas ports 325, 335, 345, vacuum ports 355 and partitions 360. The module 314 is connected to a precursor injector 320, a precursor injector 330, and a purge gas injector 340. The precursor injector 320 is configured to inject a continuous (or pulse) stream of a reactive precursor of compound A into the processing chamber 313 through gas ports 325. The precursor injector 330 is configured to inject a continuous (or pulse) stream of a reactive precursor of compound B into the processing chamber 313 through gas ports 335. The purge gas injector 340 is configured to inject a continuous (or pulse) stream of a non-reactive or purge gas into the processing chamber 313 through gas ports 345. The ports may be configured such that purge gas ports 345 may be disposed between precursor gas ports 325 and 335 so as to separate the precursors from each other (e.g., compound A from compound B), thereby avoiding cross-contamination between the precursors.

The partitions 360 may be configured such that they are positioned between each port. A lower portion of each partition extends close to each substrate to be processed, for example about 0.5 mm or greater from the substrate surface. In this manner, the lower portion of each partition 360 is separated from the substrate surface by a distance sufficient to allow the various gas streams to flow around the lower portion of the partitions toward the vacuum ports 355 after the gas streams react with the substrate surface. In addition, the partitions 360 limit cross-contamination between the precursors since they operate as a physical barrier to the precursors.

The module 314 is also connected to a pumping system 350 configured to evacuate the gas streams out of the processing chamber 313 through the vacuum ports 355 disposed in between each gas port, which serve to limit cross-contamination between the precursors.

In operation, as the wheel 310 rotates, the substrate carriers 317 of the wheel 310 successively interrupt the various gas streams as they move underneath the module 314. The substrate carriers 317 are configured to intersect the various gas streams normal to the gas streams direction. In this manner, each substrate surface is repeatedly exposed to the precursor of compound A coming from gas ports 325 and the precursor of compound B coming from gas ports 335, with the purge gas coming from gas ports 345 in between. After each exposure to the various gas streams (e.g., the precursors or the purge gas), the gas streams are evacuated through the vacuum ports 355 by the pumping system 350. Since a vacuum port is disposed on both sides of each gas port, the gas streams are evacuated through the vacuum ports 355 on both sides of the respective gas port. The gas streams flow from the respective gas ports vertically downward toward the substrate surface, across the substrate surface, around the lower portions of the partitions 360, and finally upward toward the vacuum ports 355.

Variations in the orientation of the shuttle, substrates, robot, chambers, and other system components are contemplated by the invention. Additionally, all movements and positions, such as "above", "top", "below", "under", "bottom", "side", described herein are relative to positions of objects such as the chambers and shuttles. Accordingly, it is contemplated by the present invention to orient any or all of the components to achieve the desired movement of substrates through a processing system.

While the foregoing is directed to embodiments of the present invention, other and further embodiments of the invention may be devised without departing from the basic scope thereof, and the scope thereof is determined by the claims that follow.

What is claimed is:

1. A cyclical layer deposition system, comprising:
   a processing chamber;
   at least one load lock chamber connected to the processing chamber;
   a plurality of gas ports disposed on the processing chamber, the gas ports being configured to transmit one or more gas streams into the processing chamber; and
   a plurality of vacuum ports disposed on the processing chamber between each gas port, the vacuum ports being configured to transmit the gas streams out of the processing chamber.

2. The system of claim 1, wherein the gas ports and the vacuum ports are disposed on a top portion of the processing chamber.

3. The system of claim 1, wherein the gas ports are connected to a plurality of gas injectors configured to deliver gases into the processing chamber.

4. The system of claim 1, wherein the vacuum ports are connected to a pumping system configured to evacuate the gas streams out of the processing chamber.

5. The system of claim 1, further comprising a plurality of partitions disposed between each port.

6. The system of claim 5, wherein the partitions extend from a top portion of the processing chamber to a position proximately above a substrate surface.

7. The system of claim 5, wherein a lower portion of each partition is separated from a substrate surface by a distance sufficient to allow the gas streams to flow around the lower portion toward the vacuum ports after reacting with a substrate surface.

8. The system of claim 5, wherein the partitions are positioned so as to limit cross-contamination between the gas streams.

9. The system of claim 1, wherein the gas streams flow in a direction vertical to a substrate movement direction.

10. The system of claim 1, wherein the gas ports are configured to transmit one of a precursor gas stream and a purge gas stream.

11. The system of claim 1, further comprising at least one shuttle movable between the at least one load lock chamber and the processing chamber.

12. The system of claim 1, further comprising at least one shuttle configured to move bidirectionally between the at least one load lock chamber and the processing chamber.

13. The system of claim 11, wherein the at least one shuttle is configured to carry a substrate between the at least one load lock chamber and the processing chamber.

14. The system of claim 1, wherein the gas streams comprise at least one of a first compound, a second compound and a purge gas.

15. The system of claim 14, wherein the first compound comprises one or more compounds selected from a group consisting of titanium tetrachloride ($TiCl_4$), tungsten hexafluoride ($WF_6$), tantalum pentachloride ($TaCl_5$), titanium iodide ($TiI_4$), titanium bromide ($TiBr_4$), tetrakis (dimethylamido) titanium (TDMAT), pentakis (dimethyl amido) tantalum (PDMAT), tetrakis (diethylamido) titanium (TDEAT), tungsten hexacarbonyl ($W(CO)_6$), tungsten hexachloride ($WCl_6$), tetrakis(diethylamido) titanium (TDEAT), pentakis (ethyl methyl amido) tantalum (PEMAT), and pentakis(diethylamido)tantalum (PDEAT).

16. The system of claim 14, wherein the second compound comprises one or more compounds selected from a group consisting of ammonia ($NH_3$), hydrazine ($N_2H_4$), monomethyl hydrazine ($CH_3N_2H_3$), dimethyl hydrazine ($C_2H_6N_2H_2$), t-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), and nitrogen ($N_2$).

17. The system of claim 14, wherein the purge gas comprises at least one of hydrogen, nitrogen, argon, and helium.

18. The system of claim 1, wherein the processing chamber has an annular configuration.

19. The system of claim 18, further comprising at least one shuttle configured to carry a substrate around a perimeter of the processing chamber.

20. The system of claim 18, further comprising a plurality of partitions radially disposed between an inner perimeter of the processing chamber and an outer perimeter of the processing chamber.

21. A cyclical layer deposition system, comprising:
a processing chamber;
a wheel disposed inside the processing chamber, the wheel having a plurality of circumferentially distributed substrate carriers; and
a module disposed inside the processing chamber, the module comprising:
a plurality of gas ports configured to transmit one or more gas streams into the processing chamber; and
a plurality of vacuum ports configured to transmit the gas streams out of the processing chamber.

22. The system of claim 21, wherein the vacuum ports are disposed between the gas ports.

23. The system of claim 21, further comprising a plurality of gas injectors connected to the gas ports, the gas injectors being configured to deliver the gas streams into the processing chamber.

24. The system of claim 21, further comprising a pumping system connected to the vacuum ports, the pumping system being configured to evacuate the gas streams out of the processing chamber.

25. The system of claim 21, wherein the module further comprises a plurality of partitions disposed between each port.

26. The system of claim 25, wherein a lower portion of each partition extends to a position proximately above a substrate surface.

27. The system of claim 25, wherein a lower portion of each partition is separated from a substrate surface by a distance sufficient to allow the gas streams to flow around the lower portion toward the vacuum ports after reacting with a substrate surface.

28. The system of claim 21, wherein the gas streams flow in a direction perpendicular to a substrate surface.

29. The system of claim 21, wherein the gas ports are configured to transmit one of a precursor gas stream and a purge gas stream.

30. The system of claim 21, wherein the gas streams comprise at least one of a first compound, a second compound and a purge gas.

* * * * *